United States Patent [19]
Ikata et al.

[11] Patent Number: 5,859,473
[45] Date of Patent: *Jan. 12, 1999

[54] DUPLEXER PACKAGE

[75] Inventors: Osamu Ikata; Yoshio Satoh, both of Kawasaki, Japan

[73] Assignee: Fujitsu Limited, Kawasaki, Japan

[*] Notice: The term of this patent shall not extend beyond the expiration date of Pat. No. 5,561,406.

[21] Appl. No.: 812,282

[22] Filed: Mar. 6, 1997

[30] Foreign Application Priority Data

Oct. 15, 1996 [JP] Japan ................................ 8-272521

[51] Int. Cl.$^6$ .................................................. H01L 23/34
[52] U.S. Cl. ......................... 257/723; 257/724; 333/132; 333/193
[58] Field of Search .................................. 333/126, 127, 333/128, 132, 133, 193–196, 185; 257/723, 724, 725, 700

[56] References Cited

U.S. PATENT DOCUMENTS 5,561,406 10/1996 Ikata et al. .............................. 333/126

*Primary Examiner*—Peter Toby Brown
*Assistant Examiner*—Roy Potter
*Attorney, Agent, or Firm*—Nikaido, Marmelstein, Murray & Oram LLP

[57] ABSTRACT

A duplexer package comprises two surface acoustic wave filter chips having different band center frequencies and a phase matching circuit for matching the phases of the two SAW filter chips, the filter chips and the phase matching circuit being accommodated in one unit, wherein the phase matching circuit is formed in a layer providing a cavity for the filter chips, the layer defining the cavity being located above a face for mounting the surface acoustic wave filter chips. According to the present invention, the height of the duplexer package can be lowered.

11 Claims, 17 Drawing Sheets

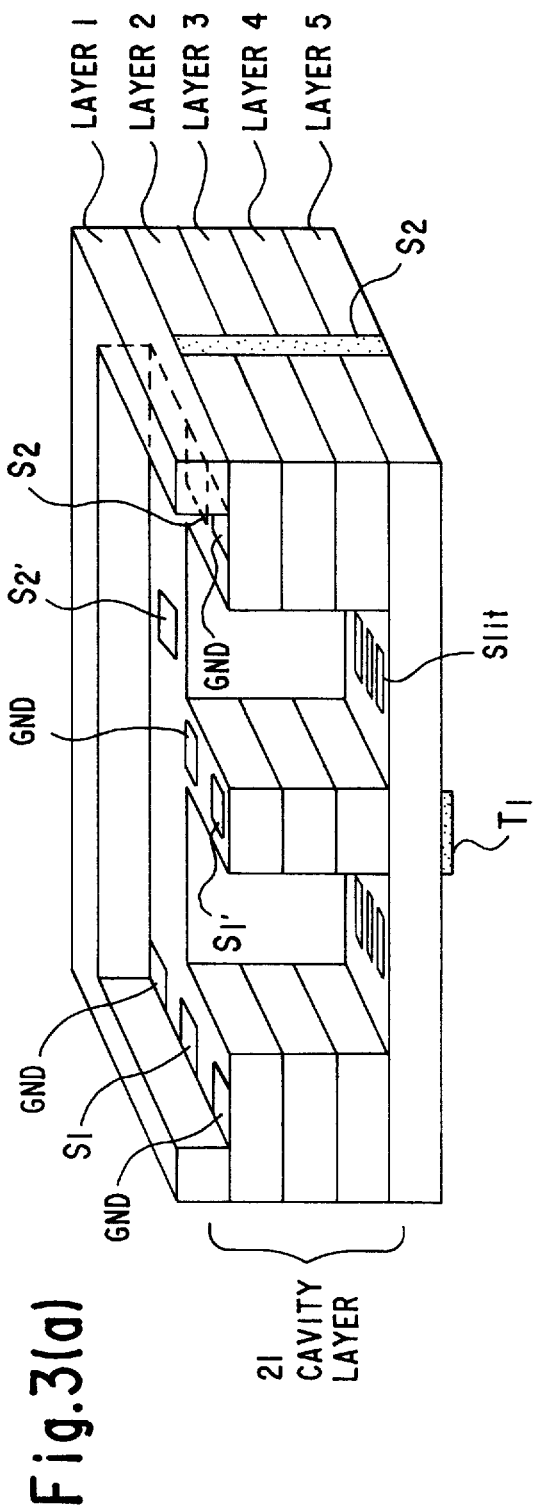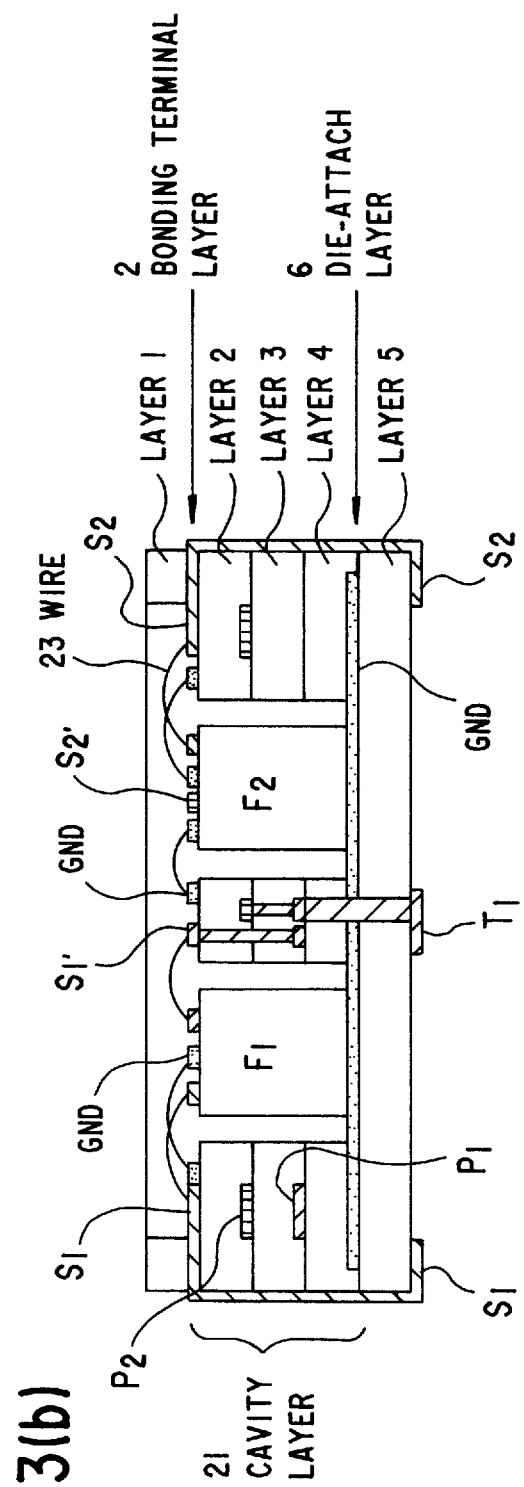
Fig.3(a)
Fig.3(b)

Fig. 5

|  | Resistance of pattern | Change in loss | Change in ex-band reflection coefficient |
|---|---|---|---|
| Embodyment 1 | 200mΩ | +0.3dB | -0.03 |
| Conventional duplexer package | 1000mΩ | +0.9dB | -0.2 |

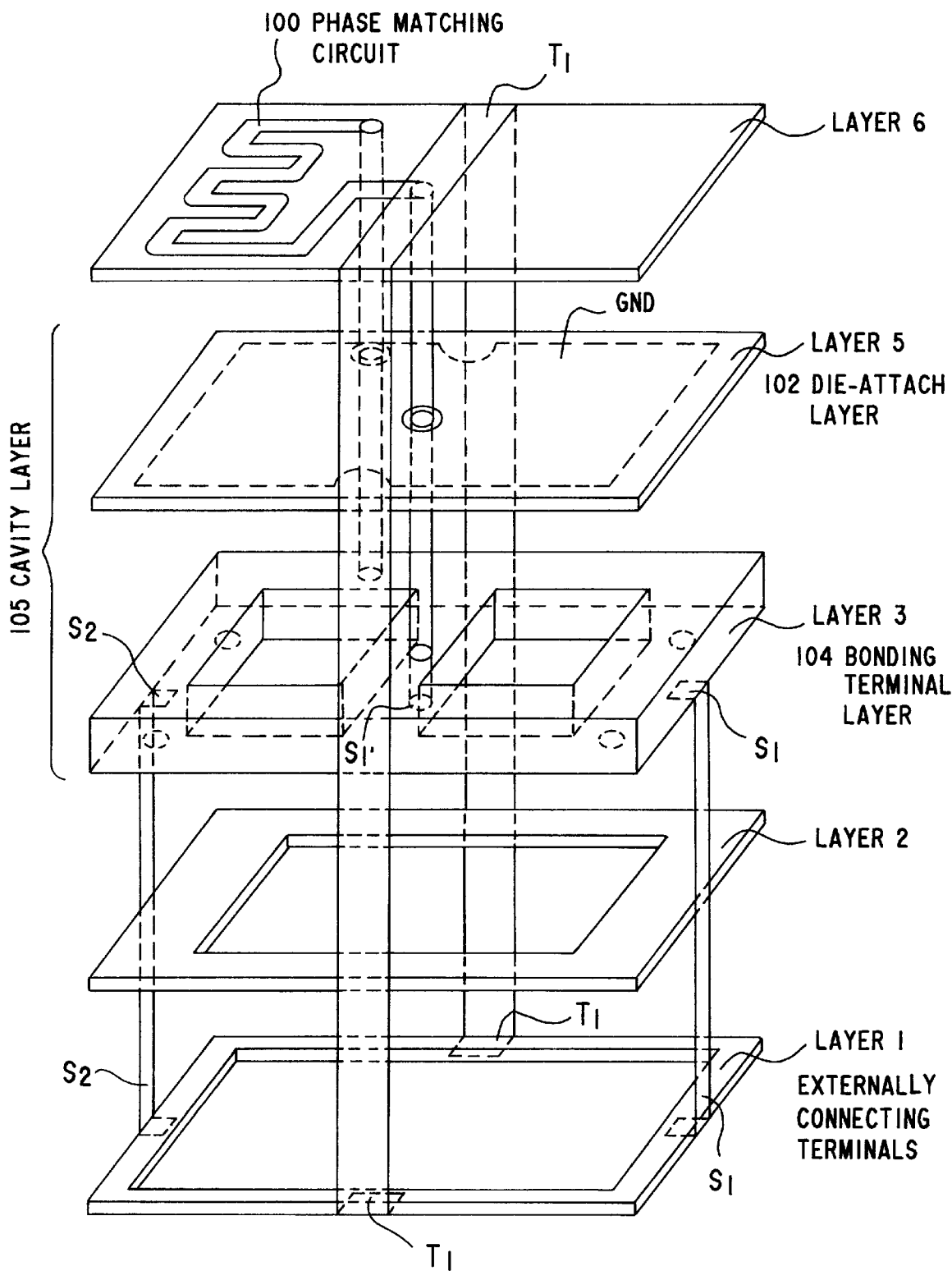

5,859,473

DUPLEXER PACKAGE

BACKGROUND OF THE INVENTION

1. Field of the Invention

The present invention relates to duplexer packages and more particularly, to duplexer packages using surface-acoustic-wave (SAW) band-pass filters.

2. Description of Related Art

In recent years, down-sized versions of mobile communication apparatuses typified by handy phones have been rapidly developed and, therefore, the parts for use therein have been desired to have a smaller size and higher performance. In mobile communication apparatuses, duplexers are used to separate or generate signals.

While most of the duplexers comprise band-pass filters using dielectrics, band-rejection fillers or a combination of these filters, duplexers using SAW filters are now under research and development for further down-sizing and higher performance.

The duplexer separates two surface acoustic waves having different pass bands to prevent the interference between the two surface acoustic waves. A duplexer comprising two SAW band-pass filter chips should be designed so as to prevent or reduce the interference of the filter characteristics of the two SAW band-pass filter chips with each other. To this end, the two SAW band-pass filter chips are each provided with a phase matching circuit, or at least one of the two SAW band-pass filter chips is provided with a phase matching circuit.

The phase-matching circuit may be placed in a multilayer ceramic package together with the filter chips to form a small duplexer package of about 2.4 mm in height.

In usual, the two filter chips included in the duplexer have different center band-pass frequencies (e.g., 836 MHz and 881 MHz). The filter chips characteristically show a small attenuation in the respective pass bands, and a large attenuation in the respective rejection bands so that the level of a signal becomes low.

It is also necessary to prevent the deterioration of the filter characteristics of the two filter chips when used in the duplexer. For this purpose, ideally, the impedance of each of the filter chips is infinity and the reflection coefficient thereof is about 1 in the pass band of the other filter chip.

For attaining the above characteristics, the phase matching circuit is connected to the filter chip. The phase matching circuit is generally formed of a strip-line, a condenser (C) or a inductance (L), the latter two being discrete devices.

In the phase matching circuit formed of the strip-line, the resistance increases proportionally to the length of the strip line. the increase in resistance may cause a signal transmission loss and increase in stray capacitance in a distribution constant.

The increase in the stray capacitance influences the phase circuit constant and the like to change the characteristics. Such influence is known to become greater specially as a higher frequency is used and as the material for packaging the duplexer is higher in dielectric constant.

To avoid this influence, a material having a low dielectric constant (e.g., alumina ceramic or glass ceramic) is used for the package and a conductor having a low resistance (e.g., tungsten) is used for the phase matching circuit.

When the discrete chip L or C is used, the constant of the phase matching circuit is not influenced much. However, due to the accuracy of the chip, delicate adjustment in phase matching is difficult. Further, since the size of the chip is large, the duplexer becomes of considerable height.

An example of a conventional duplexer comprising two SAW filter chips of band-pass type will hereinafter be described.

FIG. 12 is a block diagram illustrating the circuit construction of a conventional duplexer formed in a package. Referring to FIG. 12, the reference alphanumerics F1 and F2 denote SAW filter chips. Phase matching circuit P1 and P2 are inserted to prevent the interference of the filter characteristics of the filter chips.

Terminals T1 and T1' are common signal terminals, terminals S1 and S1g and terminals S2 and S2g are input/output terminals for separated signals. One of each of the above pairs of terminals (e.g., T1', S1g, and S2g) is connected to ground (GND).

Usually, the SAW filters F1 and F2 and the phase matching circuits P1 and P2 are accommodated in a multilayer ceramic package.

FIGS. 13 to 17 are schematic sectional views and perspective views showing the construction of conventional duplexer packages. Referring to FIG. 13, externally connecting terminal section 101 is located in the lowermost layer of the package, which corresponds to the terminals T1, S1 and S2 in FIG. 12.

A phase matching circuit 100 made of tungsten or the like is buried in an insulating layer 103.

In the duplexer shown in FIG. 13, the phase matching circuit 100 is inserted only between the filter F1 and the terminal T1.

One end of the phase matching circuit 100 is connected to the common signal terminals T1 in the lowermost layer via a through-hole and the other end is connected to the filters F1 and F2 via a through-hole. The filters F1 and F2 are disposed on a die-attach layer 102 serving as a face for mounting the filter chips, and are connected to a bonding terminal layer 104 via a wire 107.

The bonding terminal layer 104 is located on the surface of a layer 105 defining a cavity (hereafter referred to as a cavity layer), the surface being at the same height as the top surface of the filters, and is connected to the signal terminals S1 and S2 in the lowermost layer via an end portion of the package. The die-attach layer 102 is provided with a ground (GND) pattern, and the filters F1 and F2 are disposed on the GND pattern. On the uppermost layer, a cap 106 is disposed as a hermetic seal.

Referring to FIG. 14 showing a perspective view of the duplexer package shown in FIG. 13, the phase matching circuit 100 is formed in a layer 7. Via through-holes, an end of the phase matching circuit 100 is connected to the terminal S1' in the cavity layer 105 and the other end is connected to the terminal S2' and the terminal T1 which is located in the lowermost layer. The surface of a layer 5 is the die-attach layer, on which the filter chips F1 and F2 is disposed.

A ground (GND) layer is formed on the surface of a layer 9 and connected to GNDs in a layer 2 and a layer 6 via a through-hole and an end portion of the package.

The size of the conventional duplexer package as shown in FIGS. 13 and 14 is about 7.5 (length)×8.5 (width)×2.4 (height) mm.

FIG. 15 is a perspective view illustrating a conventional duplexer package wherein the phase matching circuits 100 are inserted both on a layer 7 and on a layer 8 between the filters F1, F2 and the common signal terminal T1.

Difference from the conventional duplexer package as shown in FIG. 14 lies in that the layer 8 on which the phase matching circuit 100 is formed is added. Due to the addition of the layer 8, this duplexer package is about 0.35 mm higher than that shown in FIG. 14 (2.4 mm).

FIGS. 16 and 17 show a conventional duplexer package of upside-down construction with respect to the construction shown in FIG. 13, in which the phase matching circuit 100 is formed above the die-attach layer. Compared with the duplexer package shown in FIG. 13, the insulating layer 103 can be omitted in this construction, and therefore the size of the duplexer package is about 8.5 (length)×9.5 (width)×1.6 (height) mm.

However, the phase matching circuit 100 disposed on the top, as it is, is ready to be affected by external radiant noise.

Accordingly, if a signal line such as GND lies close to the phase matching circuit 100, the characteristic impedance of the phase matching circuit changes and the device characteristics deteriorate. Therefore a certain space is necessary. Conventionally, the duplexer package having the construction as shown in FIG. 16 is employed with a space of 0.6 mm or more provided above the phase matching circuit 100. After all, this duplexer package occupies the height of 2.2 mm or more in use.

As previously mentioned, the down-sizing of the parts is highly demanded for small-sized communication apparatuses, and especially there is much more need for "the lowering the part height."

The duplexer package of multilayer construction with the buried pattern of the phase matching circuit as shown in FIG. 13 can reduce the adverse effect of the filters on each other's characteristics, but it is difficult to further down-size the duplexer package or lower the height thereof because a considerable number of layers are necessary.

Also, in the construction shown in FIG. 16, since a space of a certain height is required above the duplexer package, there is a limit to the lowering of the height. Further there is a strong possibility that the filter characteristics are adversely affected by external noise.

SUMMARY OF THE INVENTION

The present invention provides a multilayer duplexer package comprising two surface acoustic wave (SAW) filter chips having different center pass band frequencies and a phase matching circuit for matching the phases of the two SAW filter chips, the SAW filter chips and the phase matching circuit being accommodated in one unit, wherein the phase matching circuit is formed in a layer defining a cavity (a cavity layer) for the SAW filter chips, the cavity layer being located above a face for mounting the SAW filter chips.

According to the present invention, the formation of the phase matching circuit in the cavity layer for the SAW filter chips enables the height of the duplexer package to be lowered.

BRIEF DESCRIPTION OF THE DRAWINGS

FIGS. 3(a) and (b) are sectional views illustrating the multilayer construction of a duplexer package in accordance with Embodiment 1 of the present invention;

FIG. 5 is a table showing a comparison of characteristics between a conventional duplexer package and a duplexer package in accordance with the present invention;

FIG. 17 is a perspective view illustrating a conventional duplexer package.

DESCRIPTION OF THE PREFERRED EMBODIMENTS

The present invention will now be described in detail.

The present invention i s to provide a duplexer package in which a novel multilayer construction is adopted for the disposition of a phase matching pattern, a ground pattern, a common signal terminal pattern and the like, with the view to reducing signal loss in the duplexer and suppressing deterioration in the filter characteristics of the duplexer as well as lowering the height of the duplexer package.

A multilayer duplexer package in accordance with the present invention comprises two surface acoustic wave (SAW) filter chips having different center pass band frequencies and a phase matching circuit for matching the phases of the two SAW filter chips, the filter chips and the phase matching circuit being accommodated in one unit, wherein the phase matching circuit is formed in a layer providing a cavity (a cavity layer) for the SAW filter chips, the cavity layer being located above a face for mounting the SAW filter chips.

The cavity layer providing the cavity for the filter chips may be composed of a bonding terminal layer, a ground layer under the bonding terminal layer including patterns separate for the individual SAW filter chips, and a matching layer under the ground layer in which the phase matching circuit is formed.

A common ground layer may be formed in the face for mounting the filter chips, or under the face for mounting the filter chips with an insulating layer in between.

The cavity layer means a layer which locates above the face for mounting the SAW filter chips and surrounds the cavity for the two SAW filter chips.

The SAW filter chips are put in the cavity and adhered to the face for mounting the SAW filter chips. The face for mounting the chips is also referred to as a die-attach layer.

Considering the reduction of loss, the phase matching circuit is preferably made of a conductive material containing copper or silver as a principal component.

Considering the down-sizing of the device, the phase matching circuit is preferably formed of a strip line to surround the filter chips.

The present invention will hereinafter be described in detail by way of embodiments shown in the attached drawings, which are not intended to limit the scope of the invention.

Figure 1:
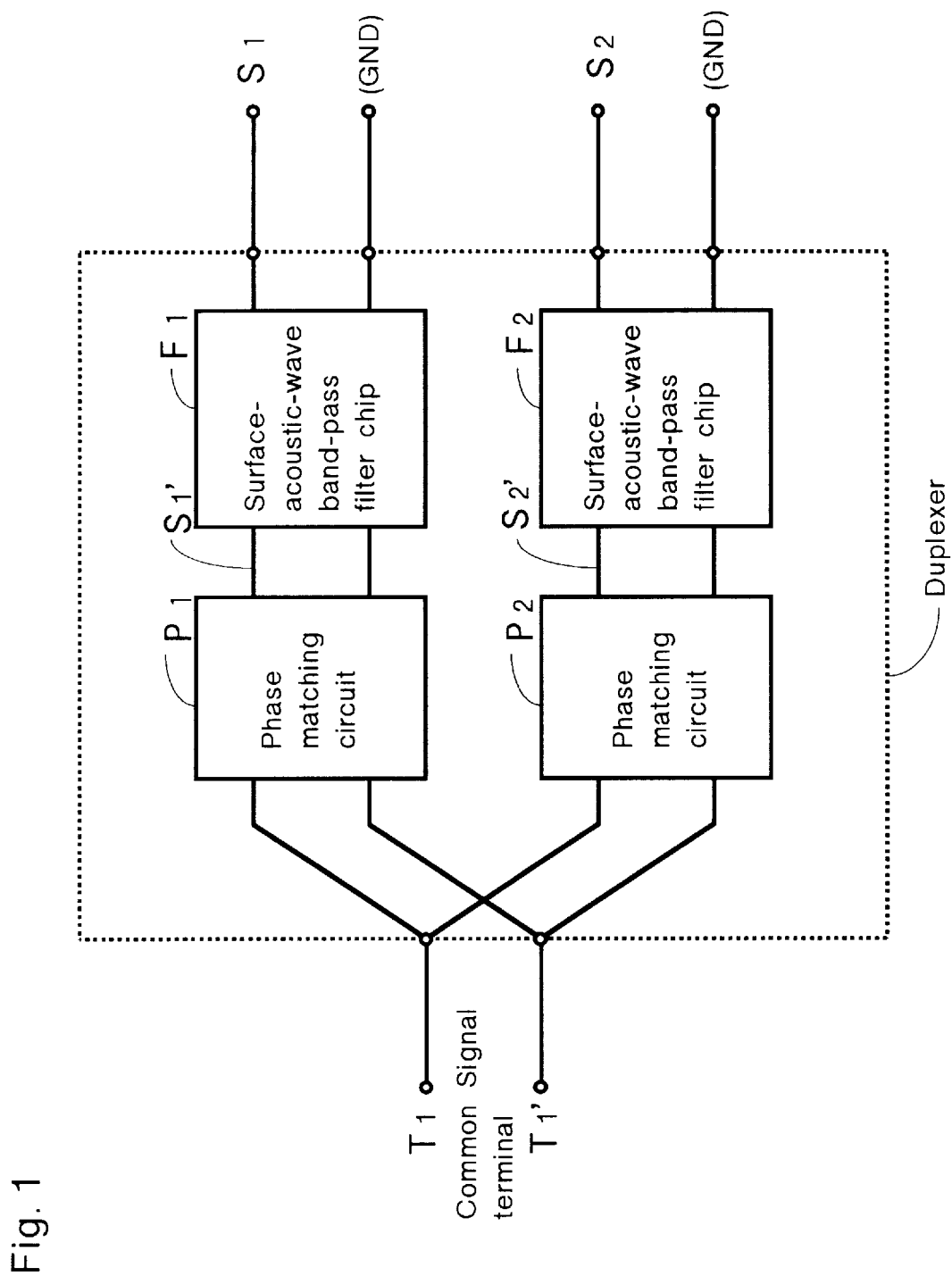
FIG. 1 is a block diagram of a duplexer in accordance with the present invention.

FIG. 1 shows a block diagram illustrating the circuit construction of a duplexer in accordance with the present invention.

Referring to FIG. 1, phase matching circuits P1, P2 are disposed between filter chips F1, F2 and common signal terminals T1, T1', respectively.

Figure 2:
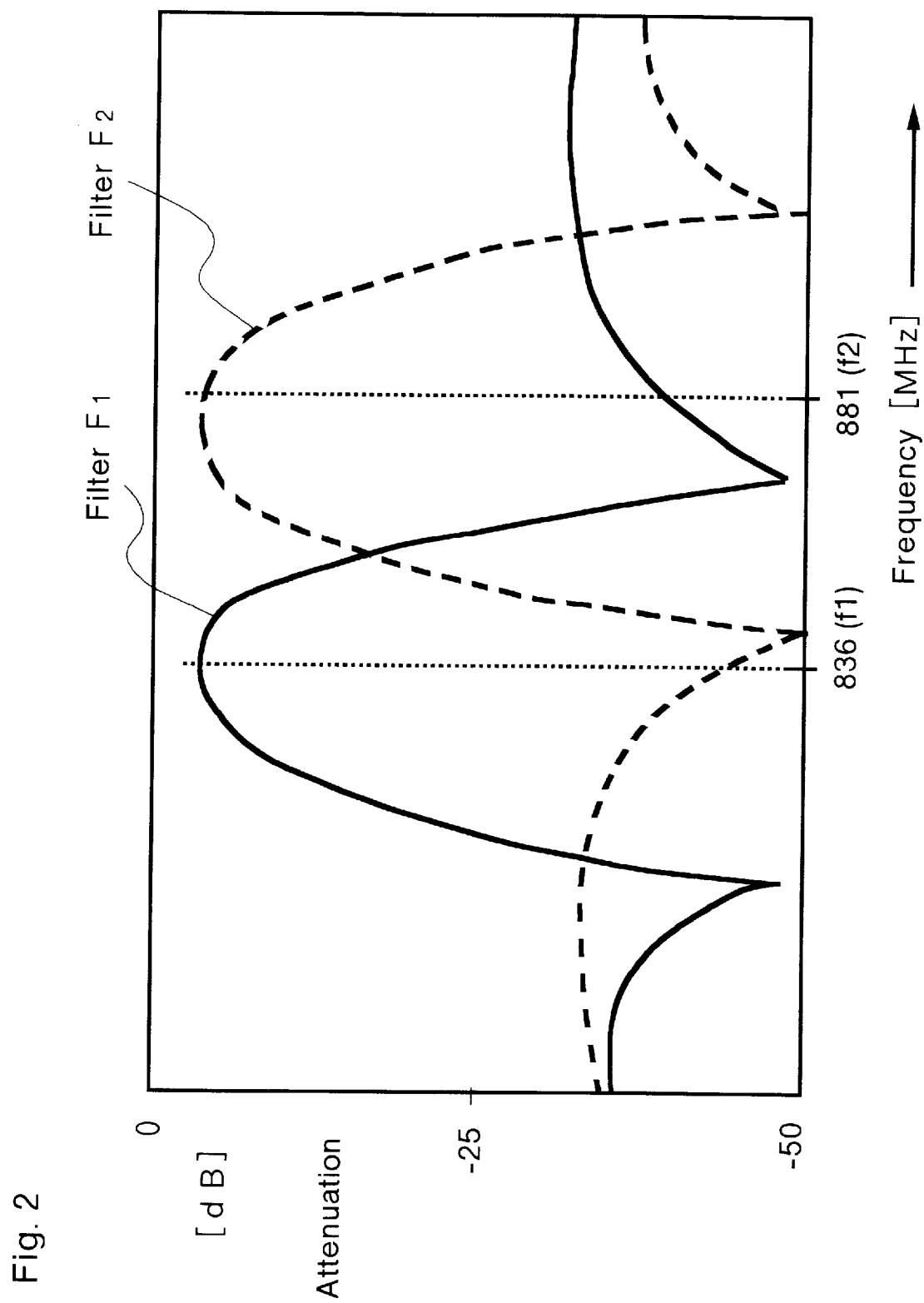
FIG. 2 is a graphical representation for the explanation of frequency characteristics of filter chips of a duplexer in accordance with the invention.

The filter chips F1 and F2 have different center pass band frequencies, each having a frequency characteristic shown in FIG. 2.

Input/output terminals S1 and S2 are terminals for inputting/outputting signals having two desired center frequencies.

For example, if the center pass band frequency of the filter chip F1 is 836 MHz, a signal having a band whose center frequency is 836 MHz is output/input to the terminal S1.

Similarly, a signal having a band whose center frequency is the center pass band frequency of the filter chip F2 (881 MHz) is input/output to the terminal S2.

Terminals (GND) other than the input/output terminals S1 and S2 as well as the common signal terminal T1' are grounded (GND).

EMBODIMENT 1

Embodiment 1 of the present invention will be described using a sectional view and a perspective view.

Figure 4:
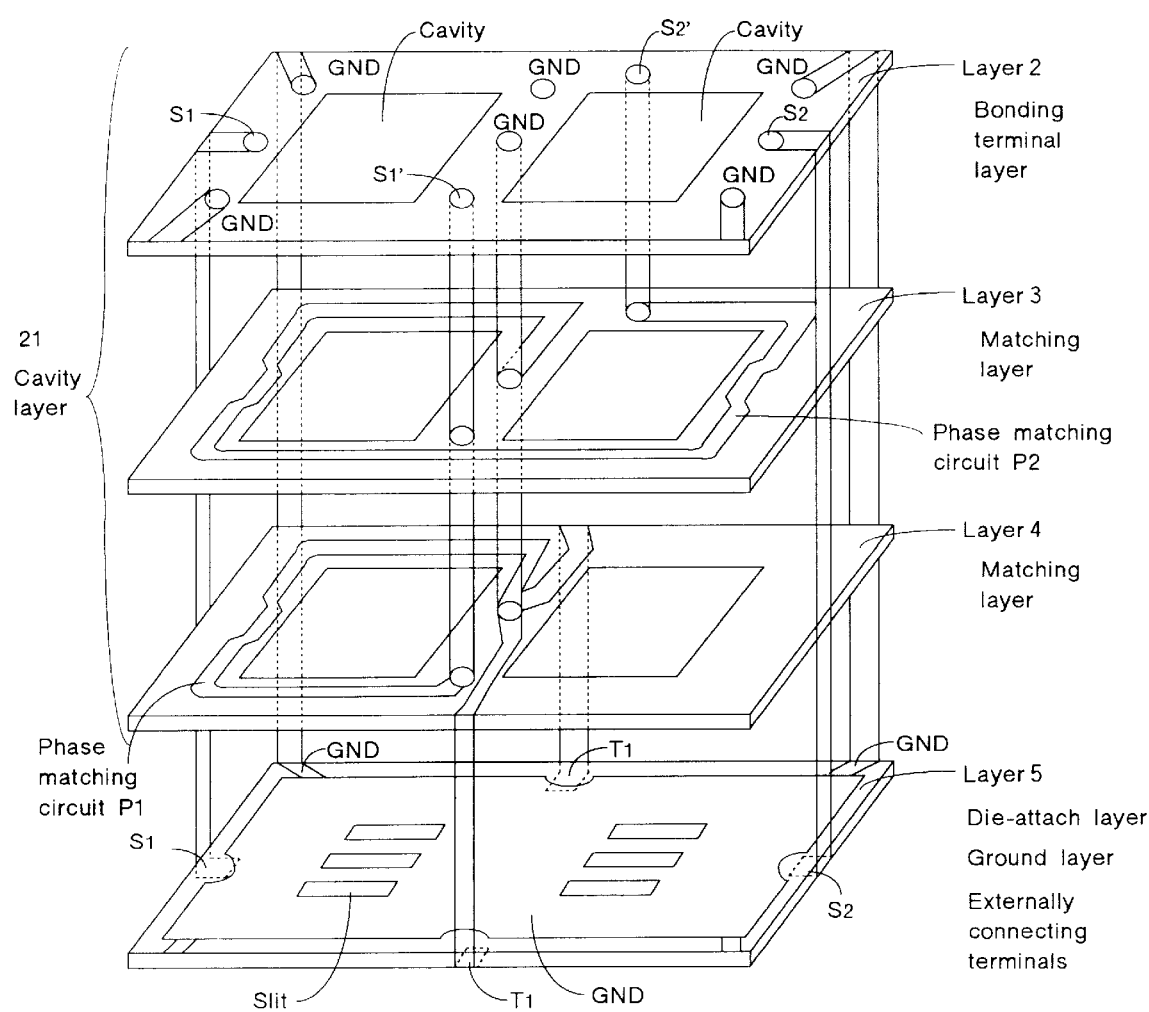
FIG. 4 is a perspective view illustrating the multilayer construction of a duplexer package in accordance with Embodiment 1 of the present invention.

FIG. 3 is the sectional view and FIG. 4 is the perspective view, both illustrating a multilayer construction of a duplexer package in Embodiment 1.

The multilayer construction is composed of five layers. And a cap, not shown, is disposed on the uppermost layer (layer 1) so as to protect the inside of the filter chip. The cap is made of a metal plated with Au, Ni or the like, or made of the same ceramic used for the package.

The layer 1 serves as a frame of the duplexer package for disposing the cap thereon. The layer 1 is made of glass ceramic. Referring to FIG. 4, the cap and the layer 1 are not shown.

Layers 2 to 4 correspond to a cavity layer 21 of almost the same height as the filter chips F1 and F2. In the layer 21, patterns for the phase matching circuits are formed (P1, P2).

The layer 2 is a layer for connecting the terminals of the filter chips to the outside. The surface of the layer 2 defines a so-called bonding terminal layer 2.

On the bonding terminal layer 2, disposed are terminals corresponding to the terminals S1 and S2 and the route S1' and S2', and the terminals are each connected to the filter chips F1 and F2 through a wire 23.

The layer 2 is made of glass ceramic, and the terminals and the wiring pattern on the surface thereof are formed of a conductor such as tungsten, Cu, Ag or the like plated with Au. The wire 23 may be made of a material such as Al—Si.

In the bonding terminal layer 2, some ground (GND) terminals are disposed as shown in FIG. 4 and connected with the GND terminals of the filter chips F1 and F2 with the wire 23.

The terminals S1, S2, and GNDs on the layer 2 are each connected to the lowermost layer 5 by through-holes or communication passes formed on the side of each layer. Two rectangles in the center of the layer 2 represent a cavity for the filter chips, in which the filter chips are inserted.

The layers 3 and 4 are made of glass ceramic, serving as matching layers on the surface of which the phase matching circuits P1 and P2 are formed respectively.

The phase matching circuits P1 and P2 are each formed of strip-line patterns. The patterns are connected to S1' and S2' of the filter chips at one end by through-holes and are connected to the common signal terminal T1 in the lowermost layer at the other end by through-holes. The line patterns of the phase matching circuits P1 and P2 may be formed to surround the cavity for the filter chips as shown in FIG. 4.

Figure 11A:
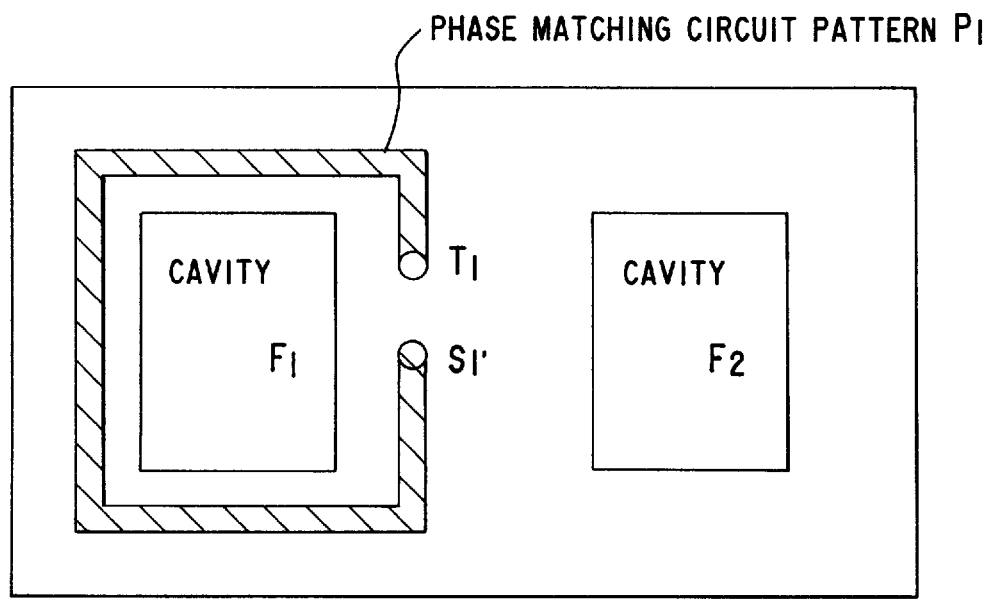
FIGS. 11 (a) and (b) illustrate exemplary patterns of phase matching circuits in accordance with Embodiment 1 of the present invention.

For example, as shown in FIGS. 11(a) and (b), the phase matching circuit P1 connected to the filter chip F1 may be formed to surround the cavity for the filter chip F1 and the phase matching circuit P2 connected to the filter chip F2 may be formed to surround the cavities for the filter chip F1 and F2.

Figure 11B:
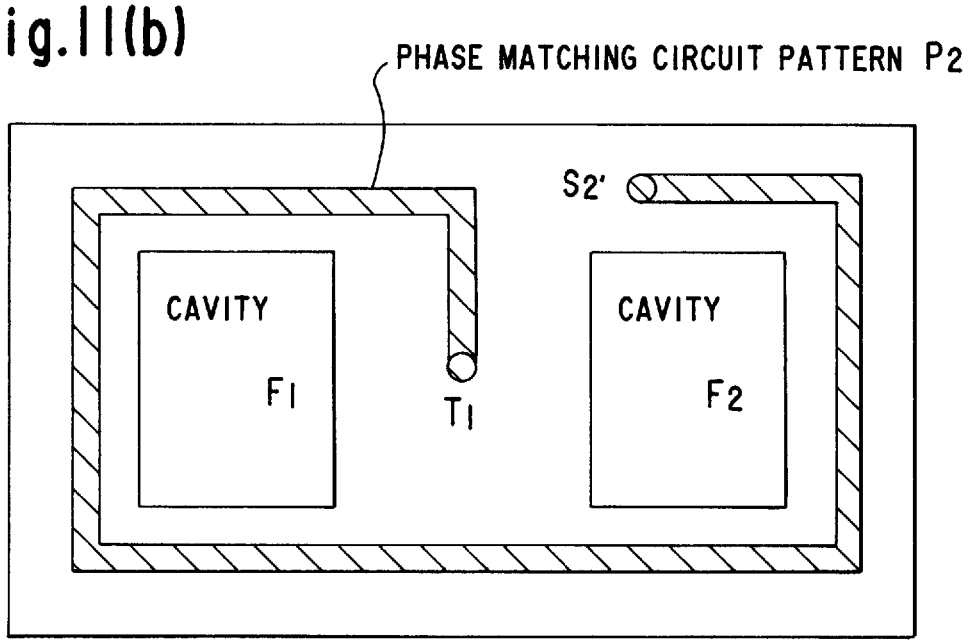
Figure 12:
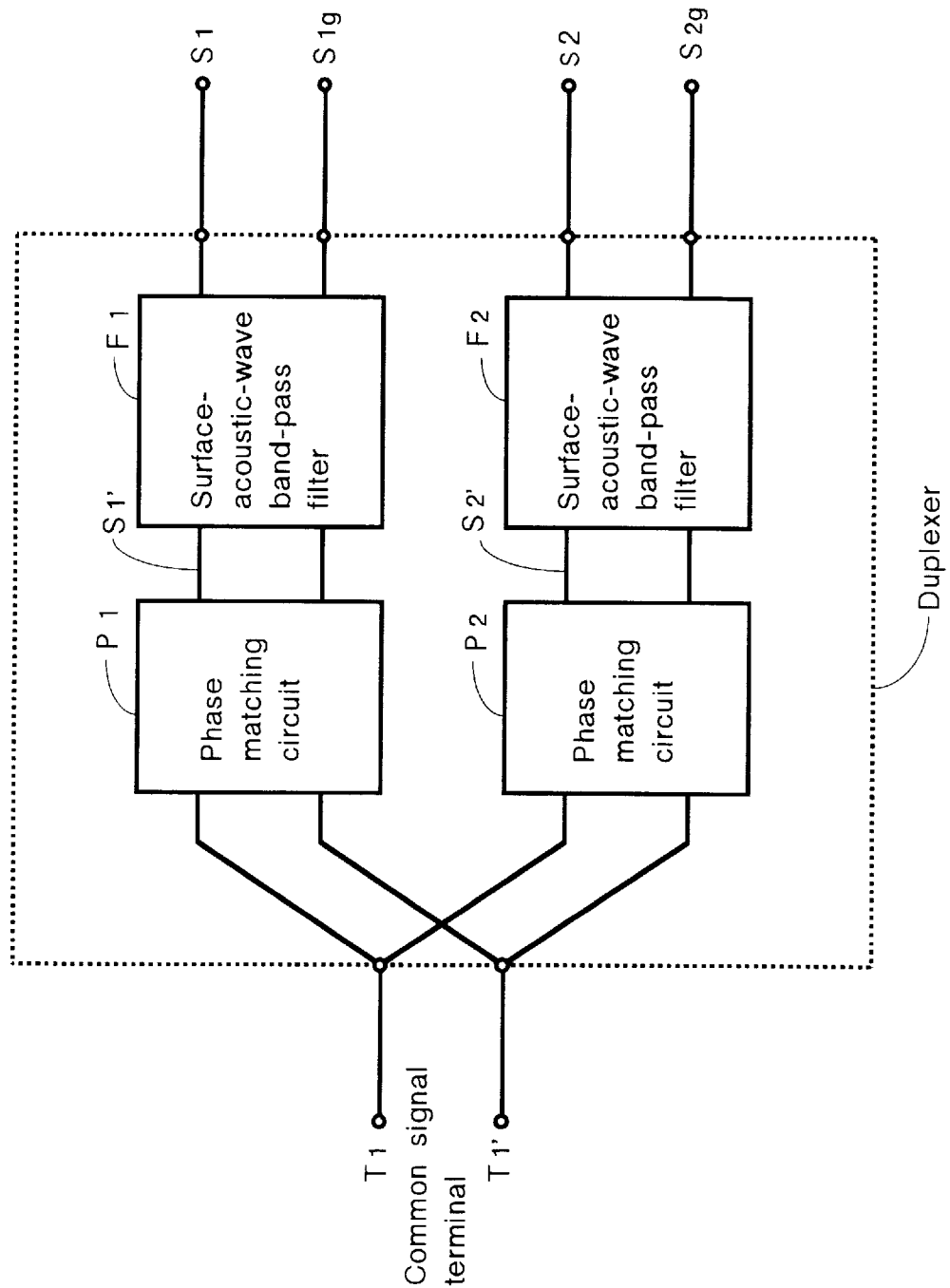
FIG. 12 is a block diagram illustrating a conventional duplexer package.

With such construction, the layers 3 and 4 need less space compared with the case where the line pattern is formed in a straight line. This contributes the down-sizing of the duplexer. However, the line pattern is not limited to that shown in FIGS. 4 and 11.

The line pattern may be shaped into other various forms. Also the line width of the line patterns may be varied. For examples, the width of the line connected to the common signal terminal T1 may be smaller than that of the line connected to the filter chip so that the line may become smaller gradually from the filter chip to the common signal terminal.

The phase matching circuits P1 and P2 are made of a material containing tungsten or copper as the principal component.

The phase matching circuit P1 may be about 25 mm in length and about 0.1 mm in width. The phase matching circuit P2 may be about 32 mm in length and about 0.1 mm in width.

The rectangulars in the center of the layer 3 and 4 represent the cavity.

The layer 5 serves as a so-called die-attach layer on which the filter chips F1 and F2 is mounted. The layer 5 is also made of glass ceramic.

A ground (GND) pattern (a ground layer) is formed in the part for mounting the filter chips and in almost all the other of the die-attach layer. The filter chips F1 and F2 are adhered to the GND layer with a conductive paste. Preferably, a slit or slits shown in FIGS. 3(a) and 4 (three slits in the figures) is/are formed in the GND pattern so that the filter chips stick well to the ceramic substrate of the layer 5.

Here, the GND pattern is formed as covers almost all the surface of the layer 5 so that the filter chips can be isolated better.

On the layer 5, in addition to the ground pattern as described above, also the externally connecting terminals (S1, S2 and T1) are disposed on the reverse side.

The externally connected terminals S1, S2 and T1 and the GND terminal are preferably disposed on the other side of the layer 5 considering the mounting of the chips and isolation characteristics.

The GND pattern and the terminals are made of the same conductive material as the wire-bonding terminal.

The above-described is the multilayer construction of the duplexer package in accordance with Embodiment 1 of the present invention, where the height of the cavity layer 21 can be about 0.5 to 0.65 mm and the height of the entire package from the lowermost layer 5 to the cap can be about 1.6 mm.

The size of the filter chips F1 and F2 is about 1.5 (length)×2 (width) mm, and accordingly the size of the entire duplexer package can be as small as about 6 (length) ×8 (width)×1.6 (height) mm.

The duplexer package of the above construction can be produced by a process as described below.

First, prepared are substrates of glass ceramic of 5.7 in dielectric constant and 0.3 mm in thickness for all the layers. A conductive material is evaporated using masks to form wiring patterns on the layers.

Then, the layers with the patterns on are attached and sintered to each other in order, and exposed conductive portions are plated with gold.

Further, the filter chips F1 and F2 are inserted in the cavities and are adhered to the die-attach layer with a conductive paste.

Lastly, the terminals on the filter chips F1 and F2 are connected to the terminals on the bonding wire layer on the layer 2 with the wire 23, and the cap is disposed above/on the layer 1.

As described above, in accordance with Embodiment 1, since the phase matching circuits P1 and P2 are formed in the cavity layer, the height of the duplexer package can be reduced to 1.6 mm compared with the conventional one (2.4 mm).

Figure 13:
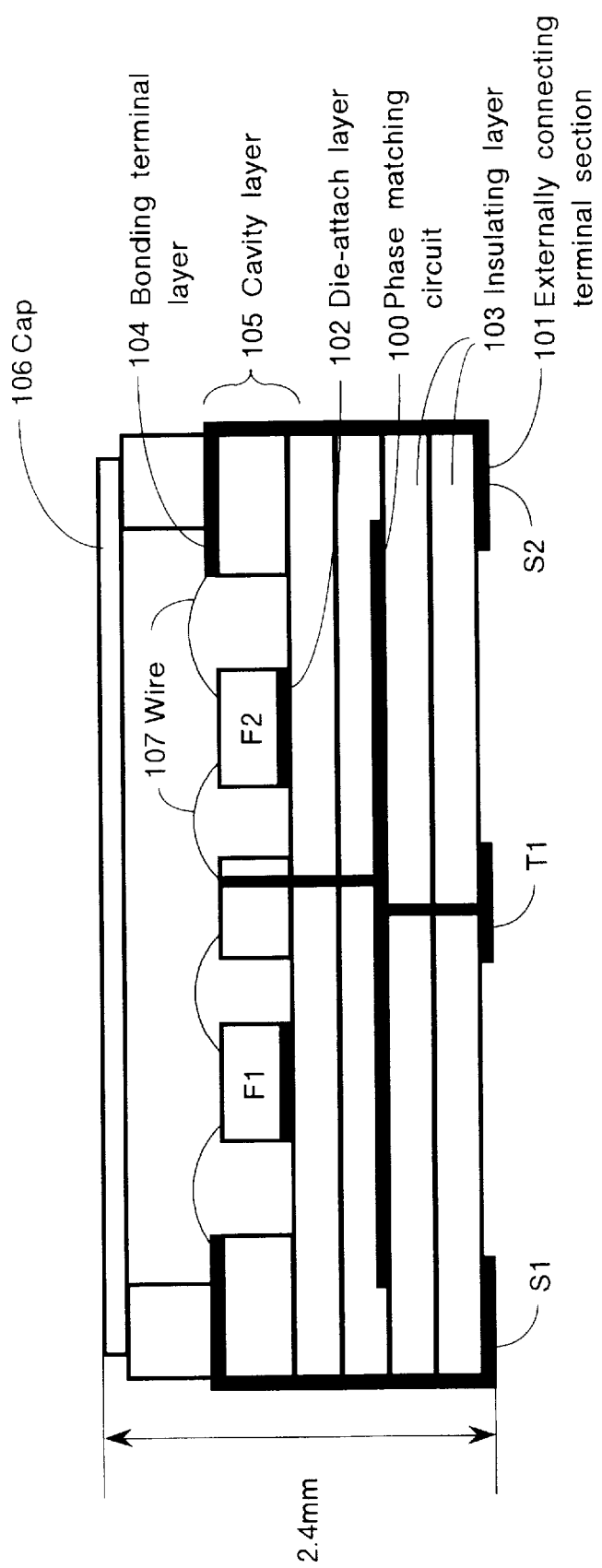
FIG. 13 is a sectional view illustrating a conventional duplexer package.
Figure 14:
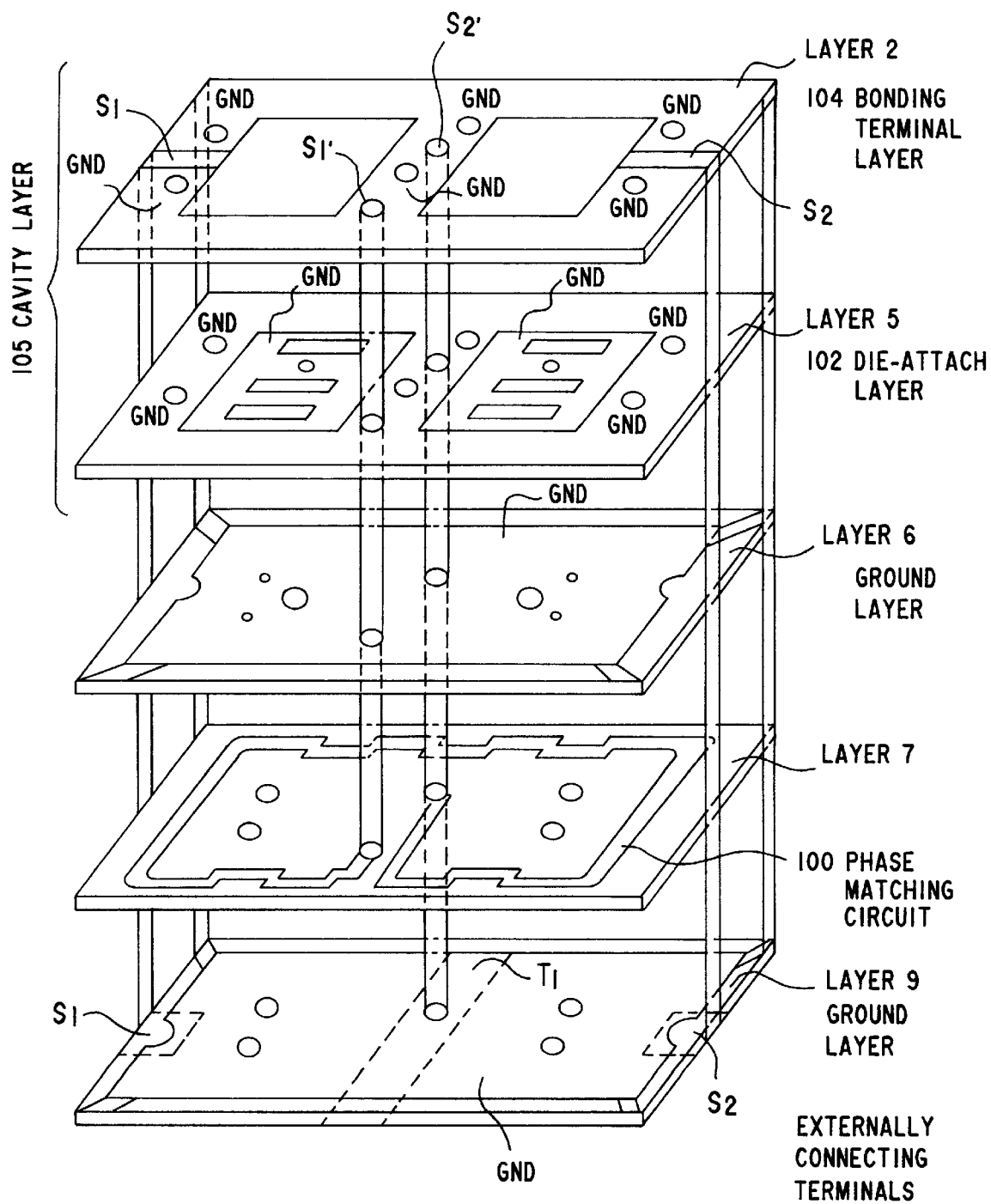
FIG. 14 is a perspective view corresponding to FIG. 13 illustrating the conventional duplexer package.
Figure 15:
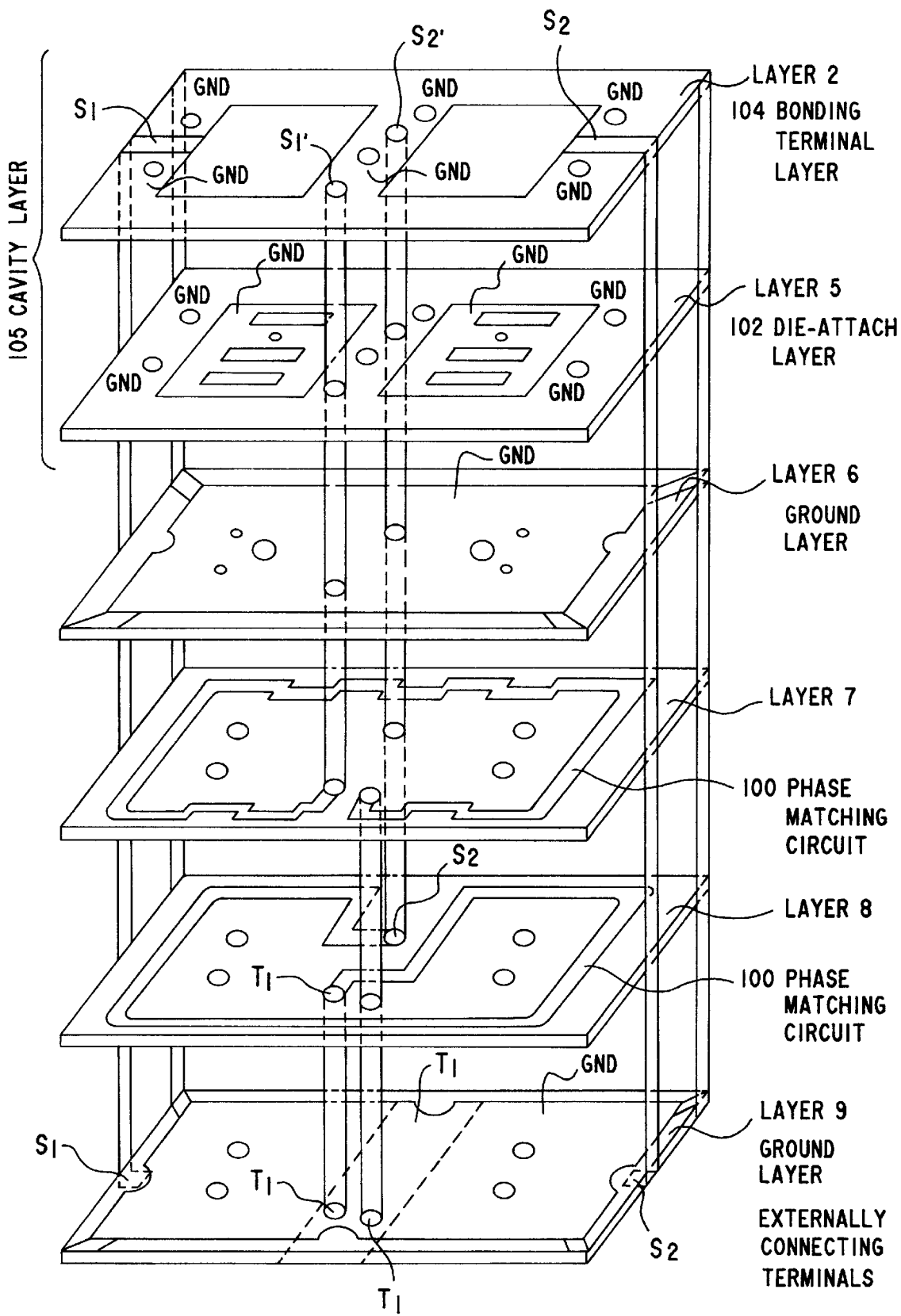
FIG. 15 is a perspective view illustrating a conventional duplexer package.
Figure 16:
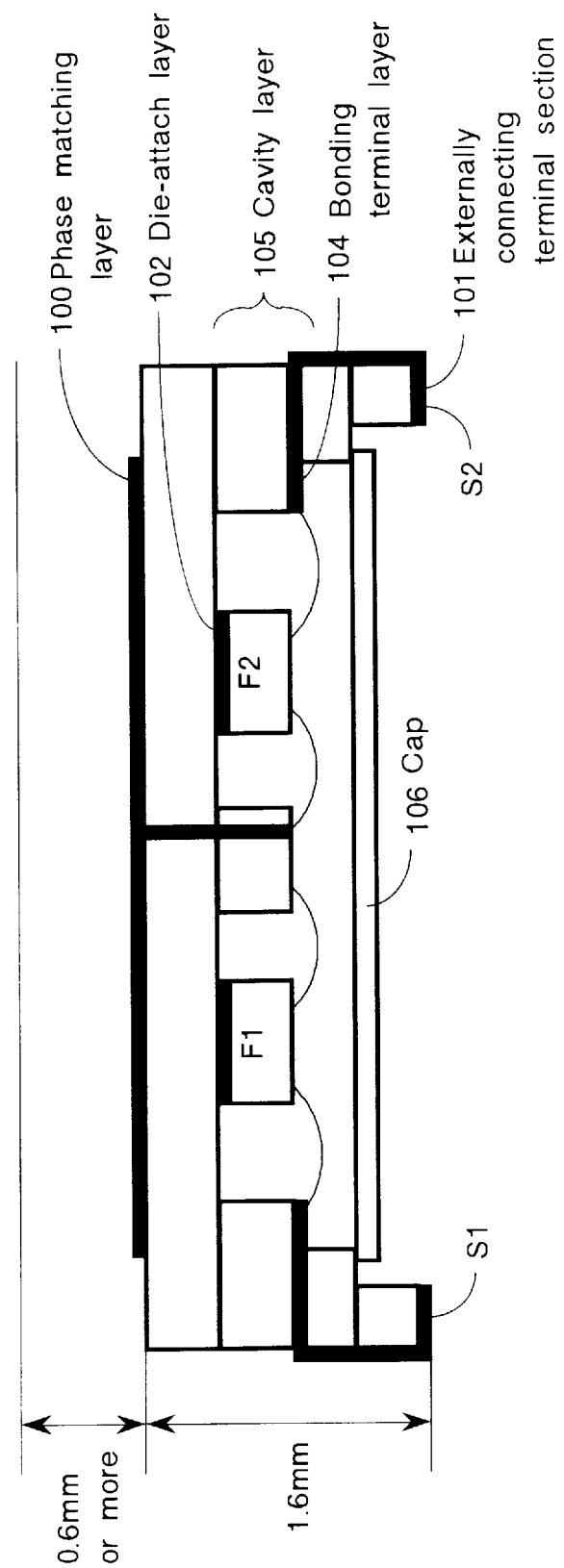
FIG. 16 is a sectional view illustrating a conventional duplexer package.

FIG. 5 shows a comparison of filter characteristic between the Embodiment 1 and a conventional duplexer package (FIG. 13).

Here, the phase matching circuit of the conventional duplexer is formed with a material of tungsten while the phase matching circuit of Embodiment 1 is formed of a material of copper (Cu) as previously described.

The pattern resistance is reduced to about one-fifth. The reduction in pattern resistance results in decrease in loss and improvement of the ex-band reflection coefficient after rotation of the phase.

In Embodiment 1, specifically, the loss can be reduced to about 0.3 dB and the ex-band reflection coefficient change can be −0.03. Therefore, explicitly, features often seen with a construction having two filters combined, i.e., a duplexer construction, are improved, especially the loss in the pass band is reduced.

Figure 6:
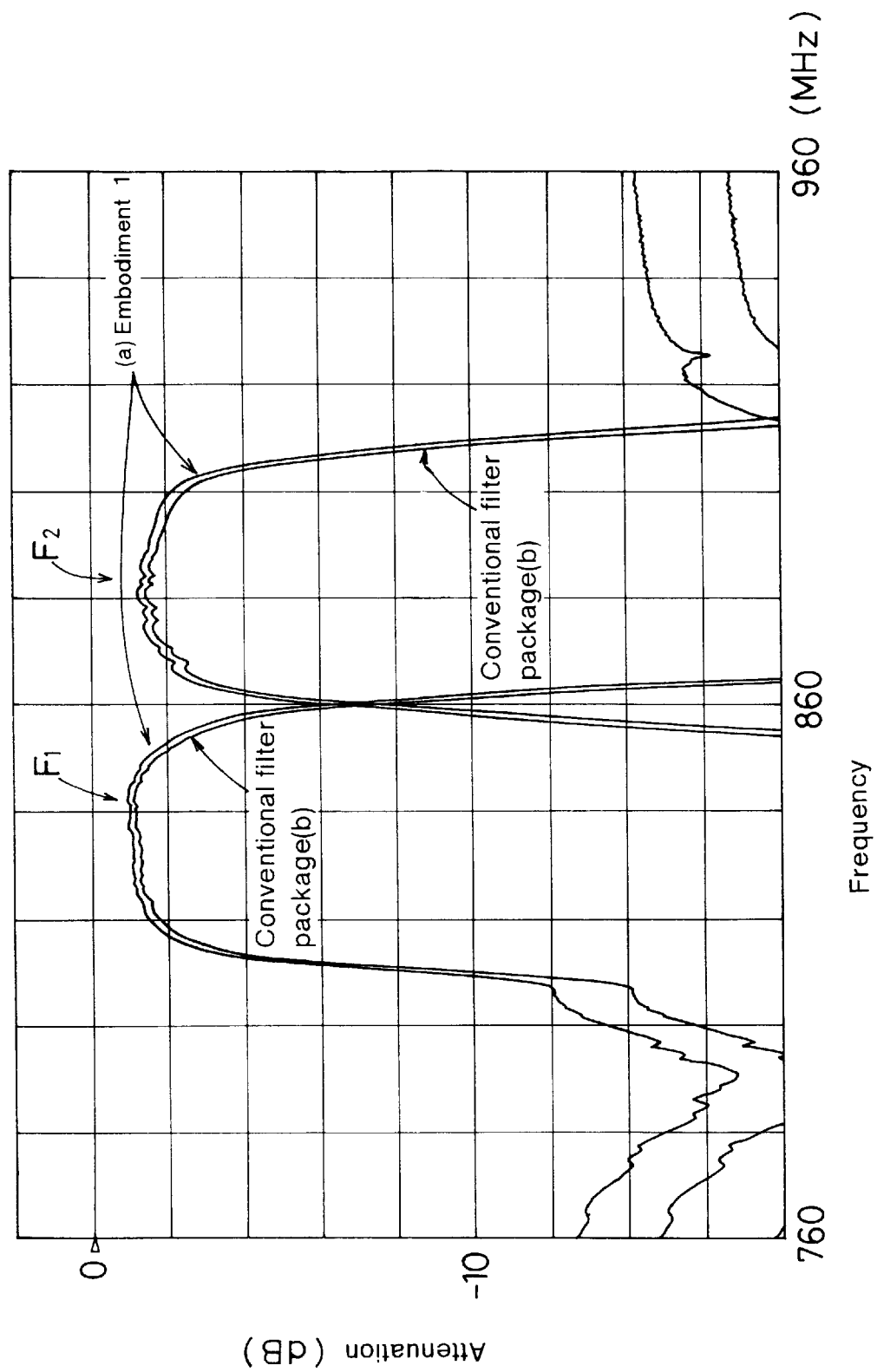
FIG. 6 is a graphical representation showing a comparison of band characteristics between Embodiment 1 and a conventional duplexer package.

FIG. 6 shows a comparison of filter characteristics when different materials are used for the phase matching circuit of the duplexer package of Embodiment 1.

Referring to FIG. 6, curves (a) represent the filter characteristics when a conductive material containing copper as the principal component is used for the phase matching circuits, as shown in Embodiment 1 of the present invention, and curves (b) represent the filter characteristics when conventionally used tungsten is used to form the phase matching circuits.

FIG. 6 shows that, according to the present invention, the attenuation is reduced by about 0.3 dB in the pass bands of the filters (824 MHz to 849 MHz and 869 MHz to 881 MHz), since the conductive material containing copper as the principal component is employed for the phase matching circuits.

The same reduction can be obtained when a silver-base conductive material is used for the phase matching circuits instead.

In this embodiment, the phase matching circuits P1 and P2 are formed between the filter chips F1, F2 and the common signal terminal T1, respectively. However, as shown in Embodiment 2, the phase matching circuit may be formed only between the common signal terminal T1 and either one of the filter chips. In this construction, since the number of the necessary layers decreases by one, the height of the duplexer package can be further lowered.

EMBODIMENT 2

Figure 7:
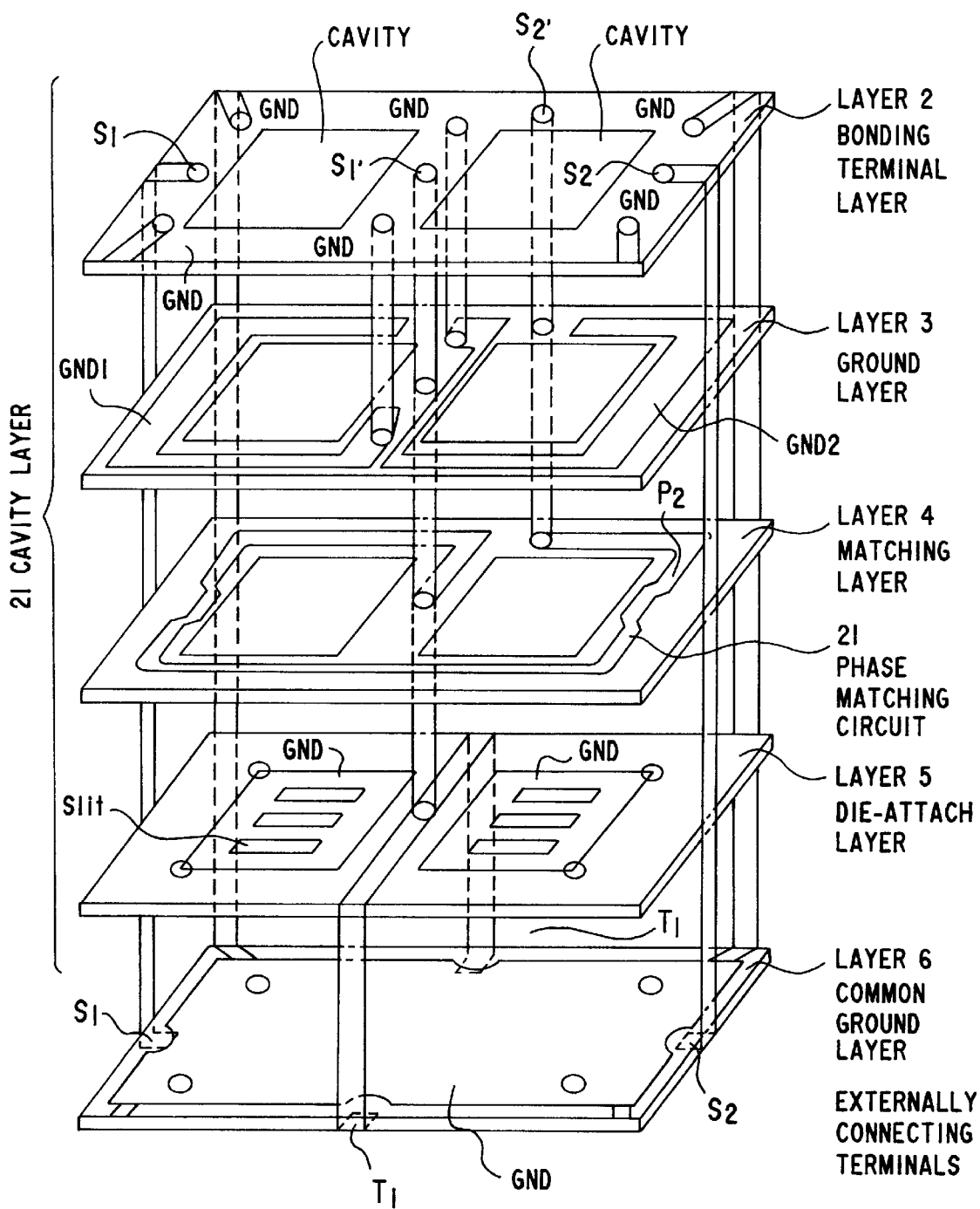
FIG. 7 is a perspective view illustrating the multilayer construction of a duplexer package in accordance with Embodiment 2 of the present invention.

FIG. 7 is a perspective view illustrating a duplexer package in accordance with Embodiment 2 of the present invention.

Referring to FIG. 7, the difference from Embodiment 1 as shown in FIG. 4 lies in that the phase matching circuit is formed on only one layer (only on a layer 4) and that GND layers (ground layers 3 and 6) are provided under the bonding terminal layer (layer 2) as well as under the die-attach layer (layer 5) which is the lowermost layer in Embodiment 1.

In other words, FIG. 7 represents an embodiment wherein the layer 4 is removed from FIG. 4 and the phase matching circuit is formed only between the filter chip F2 and the common signal terminal T1.

According to Embodiment 2, since one layer can be removed from the cavity layer 21, the duplexer package can be about 0.2 mm lower than Embodiment 1.

Though the phase matching circuit is inserted only in the circuit connected to one of the filter chips, the obtained filter characteristics are almost the same as the conventional duplexer since the phase matching circuit P2 is sandwiched between the two ground layers 3 and 6.

The ground layer of the layer 3 has cavities for the filter chips in its center, and GND patterns (GND 1 and GND 2) are formed to surround the cavities.

Preferably, these GND patterns, GND 1 and GND 2, are formed separately on the layer 3 in order to establish better isolation for the filter chips.

Both of the GND patterns, GND 1 and GND 2, are connected to GND terminals on the bonding terminal layer of the layer 2 by through-holes, and further connected to the SAW filter chips F1 and F2 with the wire.

Referring to FIG. 7, the ground layer of the layer 6, formed in such a pattern as covers almost all the surface of the layer 6, serves as a common ground layer connected to GND terminals on the layer 2. In the die-attach layer of the layer 5, the GND patterns are formed only in the portions to which the filter chips are adhered. The ground layer of the layer 6 is formed under the die-attached layer (layer 5) for mounting the filter chips with an insulating layer of glass ceramic or the like in between.

By constructing the duplexer package so that the ground layer (layer 3) is provided in the cavity layer, the common ground layer (layer 6) is provided under the die-attach layer (layer 5) in order that the phase matching circuit in the cavity is sandwiched as described above, the leak of a signal can be reduced between the terminals of the filter chips and S the phase matching circuit as well as between the two SAW filter chips, the duplexer can be less influenced by outer radiation noise, and the characteristic impedance of the phase matching line can be stabilized.

Figure 8:
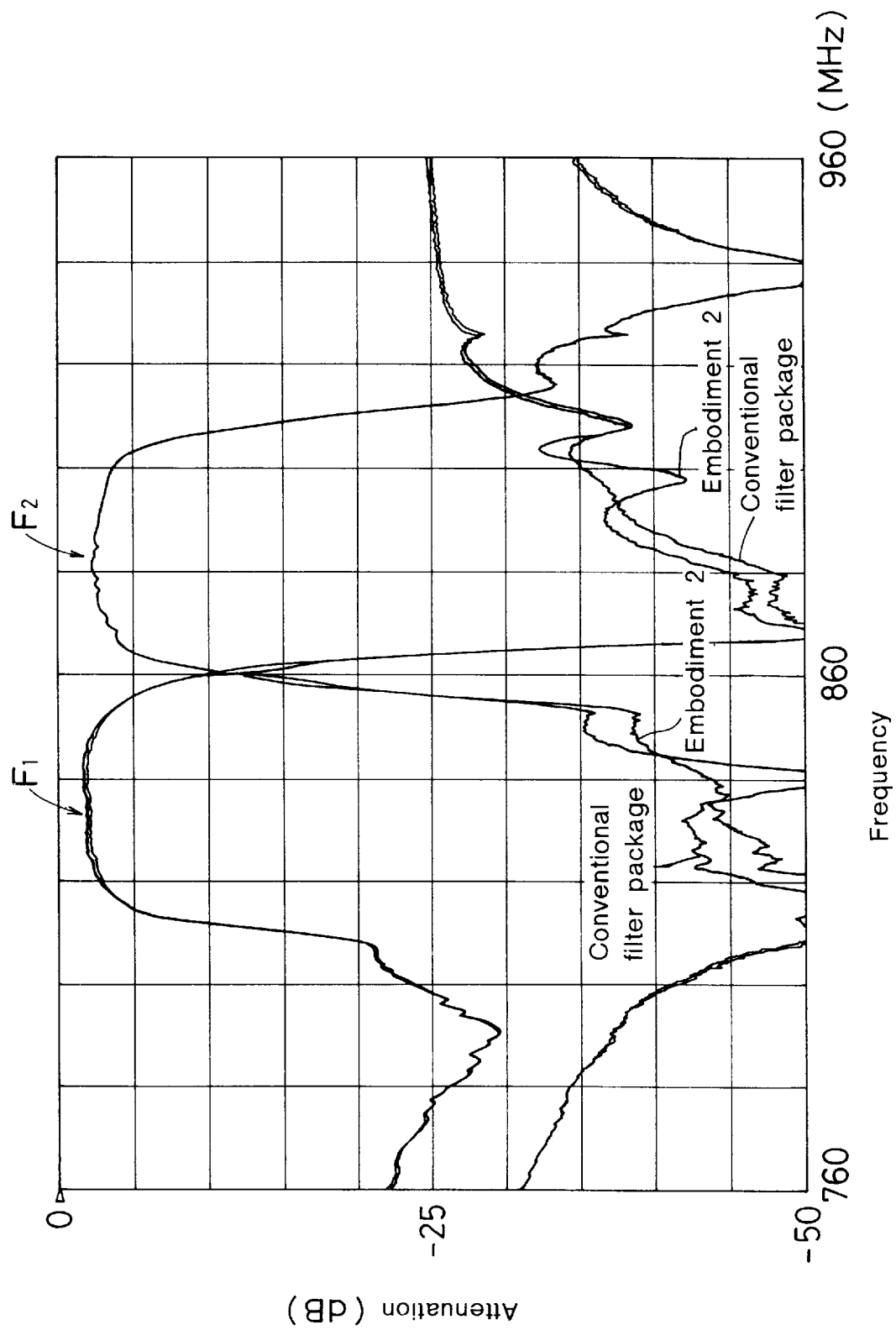
FIG. 8 is a graphical representation showing a comparison of band characteristics between Embodiment 2 and a conventional duplexer package.

FIG. 8 shows a comparison of filter characteristics between the duplexer of Embodiment 2 and the conventionally constructed duplexer as shown in FIG. 13. FIG. 8 shows that both the duplexers are almost the same in filter characteristics in the pass bands of the filter chips.

EMBODIMENT 3

Figure 9:
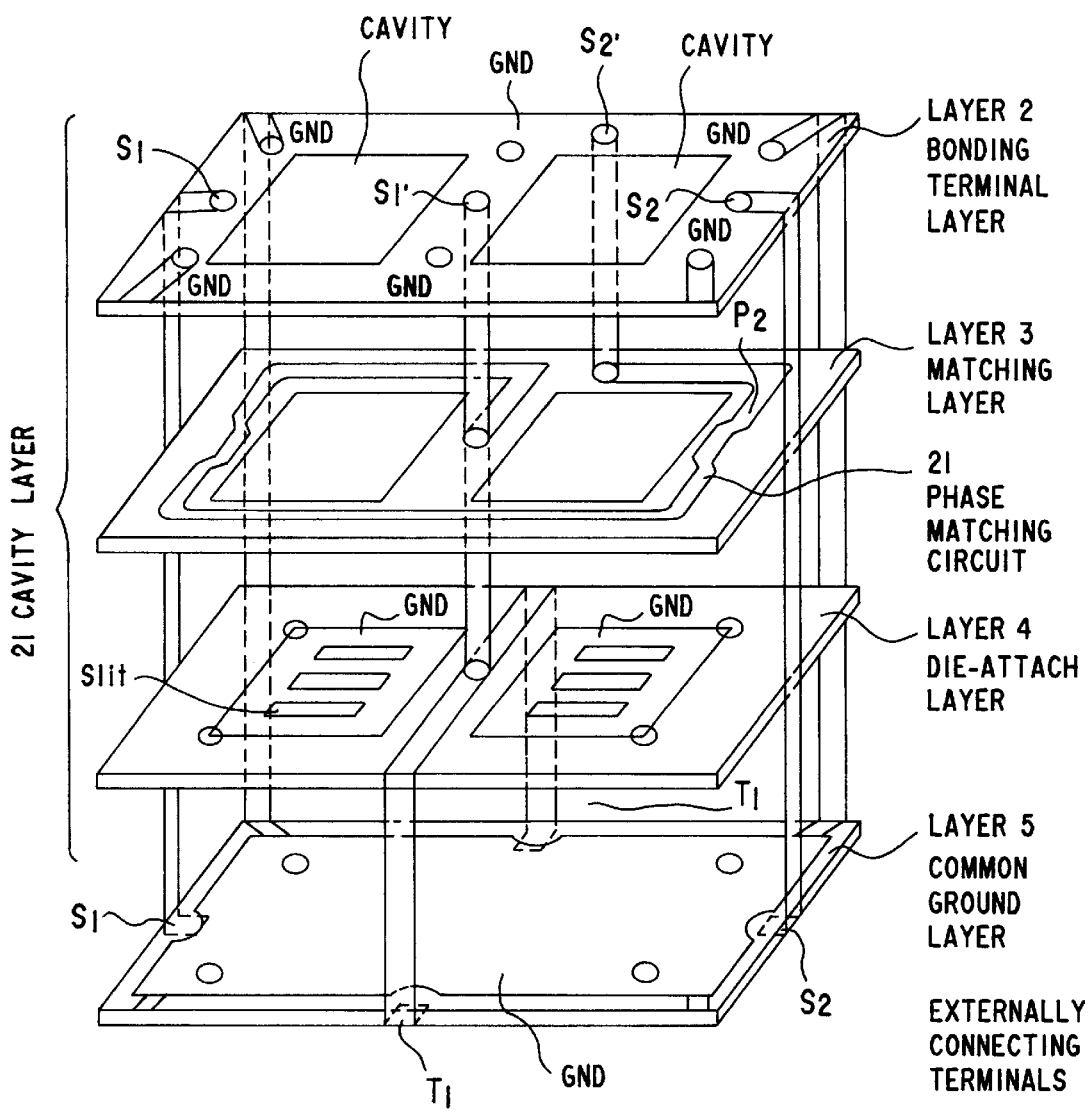
FIG. 9 is a perspective view illustrating the multilayer construction of a duplexer package in accordance with Embodiment 3 of the present invention.

FIG. 9 is a perspective view illustrating a duplexer package in accordance with Embodiment 3 of the present invention.

Referring to FIG. 9, the difference form Embodiment 2 as shown in FIG. 7 lies in that there is not a ground layer in FIG. 9 which corresponds to the layer 3 shown in FIG. 7.

This omission of the ground layer corresponding to the layer 3 results in a further reduction by an about 0.2 mm in the height of the duplexer package.

Referring to FIG. 9, Embodiment 3 is characterized in that the surface of the layer 5 under the die-attach layer (layer 4) is almost covered with a common ground layer. By providing this common ground layer, the two filter chips can be better isolated.

Figure 10:
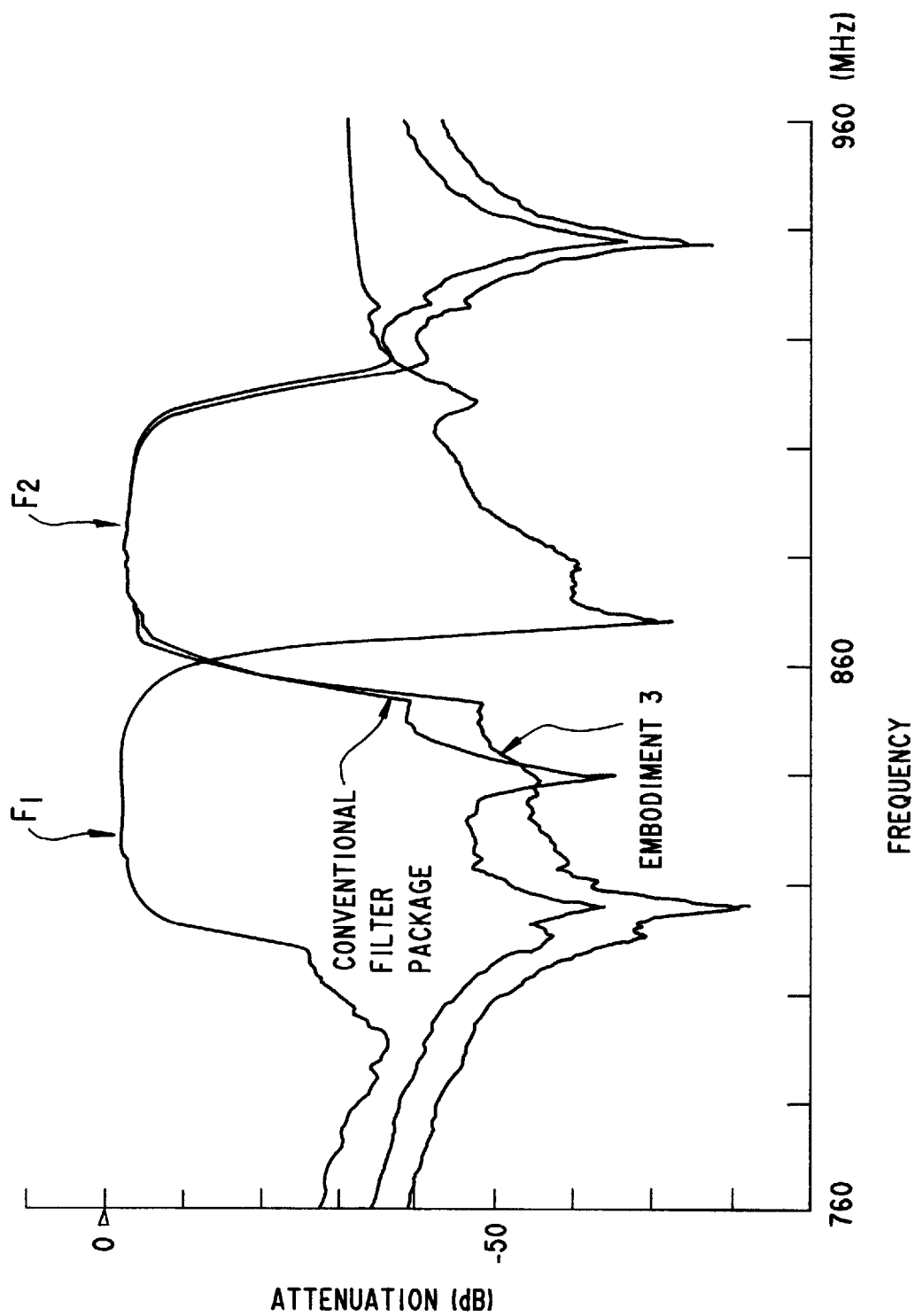
FIG. 10 is a graphical representation showing a comparison of band characteristics between Embodiment 3 and a conventional duplexer package.

FIG. 10 shows a comparison of filter characteristics between the duplexer of Embodiment 3 and the conventionally constructed duplexer as shown in FIG. 13. FIG. 10 shows that, because the attenuation around 820 MHz to 850 MHz in this invention is larger than that in the conventional one, Embodiment 3 improves in ex-band attenuation by the filter chip F2 compared with the conventional duplexer.

That is, since the ex-band attenuation can be improved by disposing the common ground layer (GND) under the die-attach layer for mounting the filter chips, the mutual adverse effect of the filter chips can be lessened.

According to the present invention, because the phase matching circuit is formed in the cavity for the filter chip, the height of the duplexer package can be lowered.

Further, because the ground layer including the patterns separately provided for the SAW filter chips is disposed between the bonding terminal layer and the matching layer in the cavity layer, the leak of a signal can be decreased not only between the filter chip and the phase matching circuit but also between the two SAW filter chips.

Still further, because the common ground layer is formed under the face for mounting the filter chips with the insulating layer in between, better isolation of the filter chips can be obtained.

If the common ground layer is formed on the face for mounting the filter chips, the height of the duplexer package can be further lowered.

What is claimed is:

1. A duplexer package comprising two surface acoustic wave filter chips having different center pass band frequencies and a phase matching circuit for matching the phases of the two surface acoustic wave filter chips, the filter chips and the phase matching circuit being accommodated in one unit, wherein the phase matching circuit is formed in a layer providing a cavity for the surface acoustic wave filter chips, the layer defining the cavity being located above a face for mounting the surface acoustic filter chips.

2. A duplexer package according to claim 1 wherein the layer providing the cavity includes a bonding terminal layer, a ground layer disposed under the bonding terminal layer, the ground layer including separate patterns for the individual surface acoustic wave filter chips, and a matching layer disposed under the ground layer, the phase matching circuit being formed on the matching layer.

3. A duplexer package according to claim 1 or 2 wherein a common ground layer is formed on the face for mounting the filter chips.

4. A duplexer package according to claim 1 or 2 wherein a common ground layer is formed under the face for mounting the filter chips with an insulating layer in between.

5. A duplexer package according to claim 3 wherein a common signal terminal is provided on the common ground layer and the phase matching circuit is formed between the common signal terminal and either one of the filter chips.

6. A duplexer package according to claim 4 wherein a common signal terminal is provided on the common ground layer and the phase matching circuit is formed between the common signal terminal and either one of the filter chips.

7. A duplexer package according to claim 1 or 2 wherein the phase matching circuit is made of a conductive material containing copper or silver as a principal component.

8. A duplexer package according to claim 1 or 2 wherein the phase matching circuit is formed of a strip-line to surround the surface acoustic wave filter chips.

9. A duplexer package according to claim 5 wherein the phase matching circuit is formed of a strip-line to surround the surface acoustic wave filter chips.

10. A duplexer package according to claim 6 wherein the phase matching circuit is formed of a strip-line to surround the surface acoustic wave filter chips.

11. A duplexer package according to claim 8 wherein the width of the strip-line varies at both ends thereof.

\* \* \* \* \*